United States Patent

Chen et al.

[11] Patent Number: 5,901,082
[45] Date of Patent: May 4, 1999

[54] ENDURANCE TESTING SYSTEM FOR AN EEPROM

[75] Inventors: Yuchuan Chen; Jun Zhu, both of Beijing, China

[73] Assignee: Winbond Electronics Corp., Hsinchu, Taiwan

[21] Appl. No.: 09/055,853

[22] Filed: Apr. 6, 1998

[51] Int. Cl.[6] .................................................. G01C 7/00
[52] U.S. Cl. ...................................... 365/185.09; 365/201
[58] Field of Search .................................. 365/200, 201, 365/185.09

[56] References Cited

U.S. PATENT DOCUMENTS 5,200,959   4/1993   Gross et al. ............................ 371/21.6

Primary Examiner—Vu A. Le
Attorney, Agent, or Firm—Kolisch Hartwell Dickinson McCormack & Heuser

[57] ABSTRACT

An endurance testing system for an EEPROM mainly includes a microprocessor, an interface circuit, a high power pulse generator and a write/erase control and VT test circuit for automatically performing erase/write operations as many times as desired and displaying the variation of the difference between the threshold voltages respectively after the erase and the write operations so that the endurance of the EEPROM can be efficiently and correctly tested.

14 Claims, 3 Drawing Sheets

Write Erase Window of EEPROM

ENDURANCE TESTING SYSTEM FOR AN EEPROM

BACKGROUND OF THE INVENTION

1. Field of the Invention

The present invention relates to an endurance testing system for an electrically erasable programmable read only memory (hereinafter referred to as an EEPROM) and, in particular, to a system for efficiently and correctly testing the endurance of the EEPROM.

2. Description of the Prior Art

Nowadays, many applications in various fields are found for EEPROMs, for example, the IC card. In that exemplary application of the EEPROM, personal data stored inside an IC card is very important and often needs to be changed. Such an application brings a high requirement on the reliability of the EEPROM, that is, the EEPROM to be utilized must be able to reliably maintain the data stored therein and to endure a significant number of write/erase operations without failure.

A typical FLOTOX (floating gate tunnel oxide) cell structure for an EEPROM is shown in FIG. 4. Referring to FIG. 4, the EEPROM cell of the FLOTOX type mainly includes a floating gate 1, a control gate 2, a drain 3, a source 4, a tunnel oxide 5 and a tunnel injection area A.

The data value stored in an EEPROM cell is determined by the charge amount in the floating gate 1 of the EEPROM cell. For the erase or write operation of the EEPROM cell, high voltages of different voltage polarities are required to be applied between the control gate 2 and the tunnel injection area A of the EEPROM cell to generate an FN (Fowler-Nordheim) tunnel current for changing the charge amount in the floating gate 1.

During the write operation, the floating gate 1 is charged by the tunnel current from the drain 3 of the EEPROM cell so that the threshold voltage (hereinafter referred to be as VT) thereof becomes more positive, wherein the VT is defined as the VGS value which make IDS equals $1\,\mu A$ when VDS equals 1V.

During the erase operation, the electrons in the floating gate 1 flow to the drain 3 as a tunnel current so that the VT of an EEPROM cell changes toward the negative direction. Furthermore, the data stored in an EEPROM cell can be obtained by a read operation which is also well known in this field and thus is not described herein.

The number of write/erase operations for which an EEPROM can endure is a very important index of endurance of the EEPROM. Particularly, the variation of the difference (window) between the threshold voltage after a write operation and the one after an erase operation can reflect the features of endurance and physical nature of the EEPROM.

In order to test the features of the endurance for an EEPROM cell, the prior art adopts the following steps: testing the threshold voltage (VT) thereof, switching to a write/erase circuit, generating write/erase pulses to perform programming, and switching back to the VT test circuit. The above procedures are controlled manually in the prior art. Not only is the test efficiency very low, but also the results are not reliable.

Therefore, there is a need to have a testing system capable of automatically performing erase/write operations as many times as desired and displaying the variation of the difference between the threshold voltages respectively after a write operation and an erase operation versus the operation times.

SUMMARY OF THE INVENTION

The present invention provides an endurance testing system for an EEPROM, which applies negative feedback principles to track the threshold voltage of an EEPROM cell and further utilizes a microcomputer for automatically controlling the processes of write/erase operations thereof.

One object of the present invention is to provide an endurance testing system for an EEPROM, which can automatically detect and show the threshold voltage of an EEPROM cell.

One of the other objects of the present invention is to provide an endurance testing system for an EEPROM, which can automatically switch among the three states, that is, the write state, erase state and VT test state, and prevent unnecessary damage which may occur due to manually switching during test processes, for ensuring that the test results are reliable.

Another one of the objects of the present invention is to provide an endurance testing system for an EEPROM which can automatically supply triggering pulses to a high voltage pulse generator, such as HP 214B, for the programming of an EEPROM cell to facilitate the provision of necessary programming voltage pulses.

According to an aspect of the present invention, an endurance testing system for an EEPROM is provided and includes a processing unit, a pulse generator, and a control and test circuit for testing the endurance of an EEPROM cell. Said processing unit capable of executing a program generates control signals to the pulse generator and the control and test circuit. The pulse generator can generate a pulse with different duration and magnitude according to the control signals from the processing unit. The control and test circuit receives the control signals and the pulse respectively from the processing unit and the pulse generator to perform a write, erase, or threshold voltage-testing operation on the EEPROM cell and detect the threshold voltage thereof. Therefore, the endurance testing system for an EEPROM of the present invention can enable the endurance test of an EEPROM to be efficiently and correctly tested.

Further aspects, objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
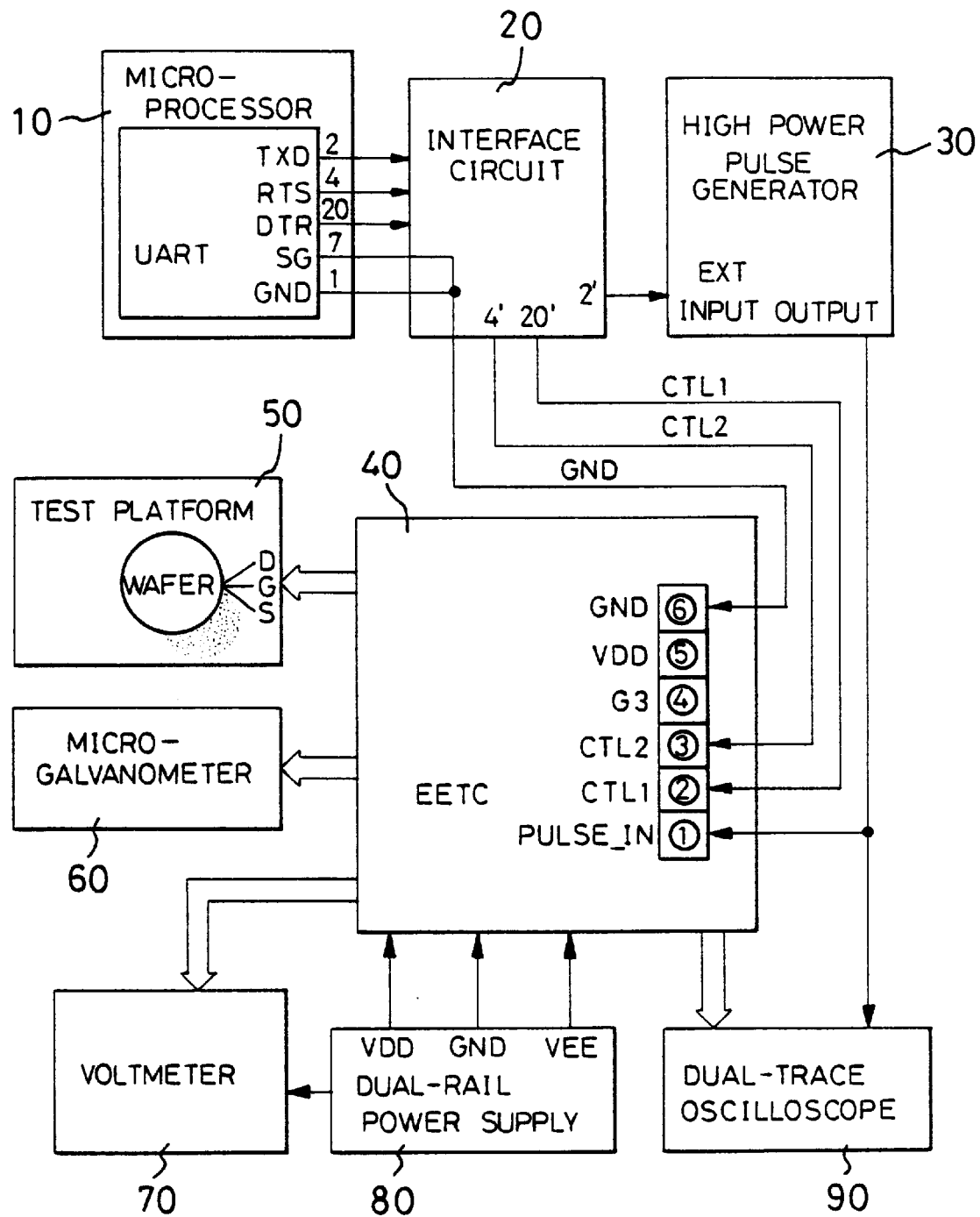
FIG. 1 is a schematic block diagram of an endurance testing system for an EEPROM according to a preferred embodiment of the present invention.

Referring to FIG. 1, an endurance testing system for an EEPROM according to a preferred embodiment of the present invention is shown. The system mainly comprises a microprocessor 10, an interface circuit 20, a high power pulse generator 30, a write/erase control and VT test circuit (hereinafter referred to as EETC) 40, a test platform 50, a microgalvanometer 60, a voltmeter 70, a dual-rail power supply 80, and a dual-trace oscilloscope 90.

In the preferred embodiment, the voltage magnitude of the output pulse of the high power pulse generator 30 is not less than 16V, and the duration and frequency of the output pulse are both adjustable. Furthermore, the dual-rail power supply 80 can provide a 16V positive DC voltage VDD and a −4V negative DC voltage VEE in this preferred embodiment, however, the polarity and magnitude of the output voltages can be changed according to the application.

The write/erase control and VT test circuit (EETC) 40 is one of the important features of the present invention. According to the preferred embodiment of the present invention, the system will be explained basically around the EETC 40.

As shown in FIG. 1, the control signals issued by the microprocessor 10 are converted to the signals for use in the other components of the system by means of the interface circuit 20. The high power pulse generator 30 can generate a pulse with a predetermined width and level depending on the application. The pulse generated by the high power pulse generator 30 can be observed on the dual-trace oscilloscope 90. The signals CTL1, CTL2 generated by the interface circuit 20 are connected to the corresponding inputs of the EETC 40 for the control of different test modes, that is, the write, erase and VT test modes. The EETC 40 is further connected with the test platform 50, micro galvanometer 60, voltmeter 70 and dual-trace oscilloscope 90.

In this embodiment, the endurance testing system for an EEPROM of the present invention is preferred to operate with a software during the testing of the endurance of the EEPROM. Such a program may mainly include a loop consisting of write, erase and VT test instructions. The program may further provide a user friendly interface to let a user input necessary data, for example, the loop times, and observe test results which may be displayed on a monitor (not shown).

As described above, it can be understood that the flow of the system signals is that the microprocessor 10 executing a program receives an order from a user and initiates to perform an automatic test of the endurance of the EEPROM; the microprocessor 10 issues control signals corresponding to the operation of a write, erase or VT test instruction in the program; and the control signals are converted and transmitted by the interface circuit 20 to the EETC 40 to enable the D, G and S probes of the test platform 50 to be electrically connected to appropriate locations on a wafer to be tested.

In this preferred embodiment, the EETC 40 may mainly include three two-input multiplexers whose outputs are selected by the signals CTL1, CTL2 from their inputs which include the pulse from the high power pulse generator 30, VDD, VEE and the ground (GND). However, the implementation of the EETC 40 is not limited to the above way which is merely for illustrative purpose.

In the case of a write or erase instruction, the microprocessor 10 will generate a signal to trigger the high power pulse generator 30 through the interface circuit 20. Then, the high power pulse generator 30 generates a pulse to be used in the test platform 50 through the EETC 40 for performing the write or erase operation of the EEPROM cell to be tested.

However, in the case of a VT test instruction, the high power pulse generator 30 is isolated from the EETC 40. At this moment, the EETC 40 will provide an environment conforming to the VT definition as described above to the test platform 50. Through the EETC 40, the micro galvanometer 60 will detect and show the IDS current of the EEPROM cell and the voltmeter 70 will detect and show the VGS voltage thereof. Then, a VT value of the EEPROM cell can be obtained and recorded.

Figure 2:
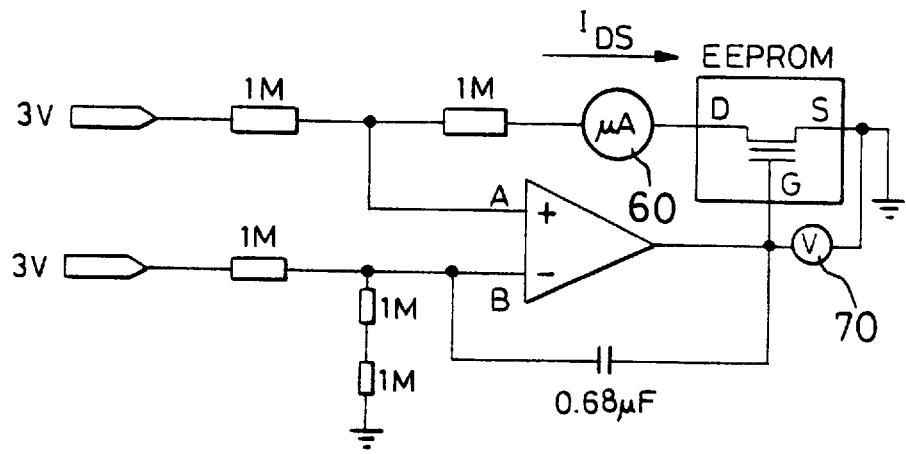
FIG. 2 shows a circuit for automatically tracking the threshold voltage of an EEPROM cell according to a preferred embodiment of the present invention.

According to a preferred embodiment of the present invention, the EETC 40 is preferred to include a negative feedback circuit for automatically tracking the VT, which is shown in FIG. 2. The negative feedback circuit mainly consists of an operational amplifier, a capacitor of 0.68 $\mu$F and five resistors of 1M $\Omega$.

Referring to FIG. 2, the voltage potential of the negative input B of the operational amplifier is approximately two volts. Because of negative feedback principles, such a circuit will come to a stable state and the voltage potential of the positive input A of the operational amplifier will also be approximately the same as input B, that is, two volts. Therefore, assuming the input current of the operational amplifier is negligible, the current IDS will be 1 $\mu$A which can be observed by the micro galvanometer 60 and the VDS of the EEPROM cell under test will be one volt. Therefore, at such a stable state, the VGS voltage of the EEPROM cell is exactly the threshold voltage thereof and can be observed by the voltmeter 70.

Figure 3:
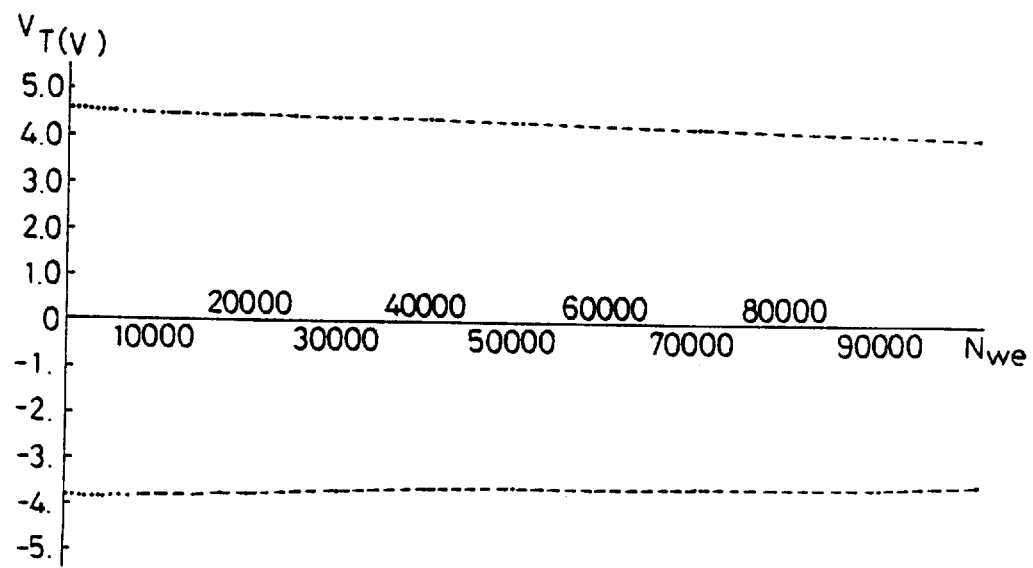
FIG. 3 shows the erase/write window of the EEPROM, which is obtained by an endurance testing system for an EEPROM according to a preferred embodiment of the present invention.
Figure 4:
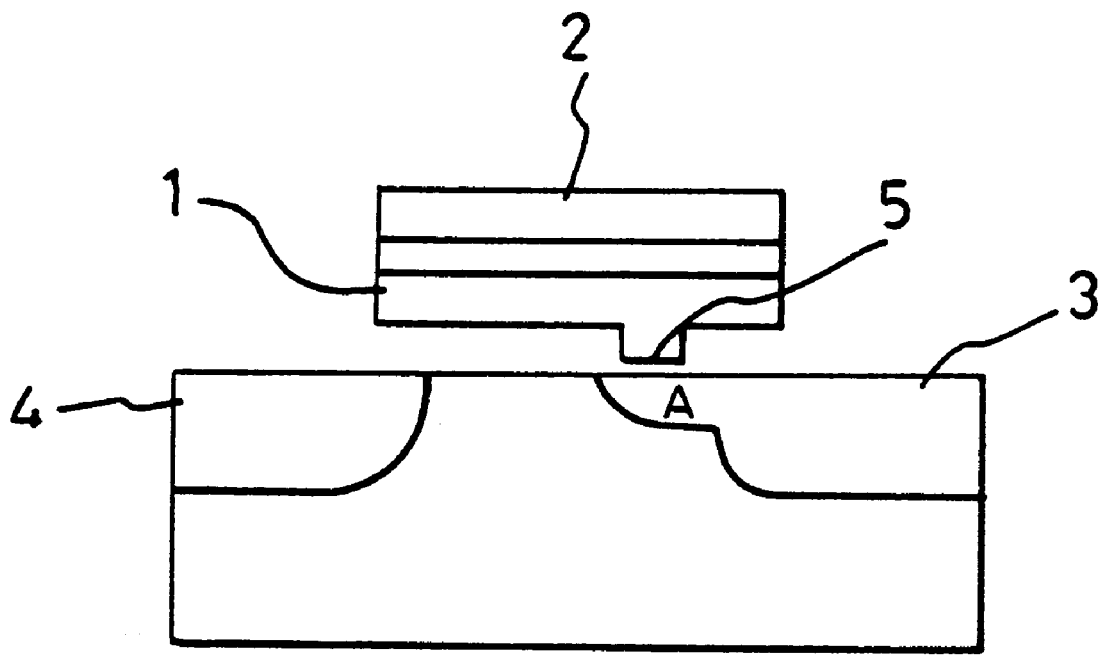
FIG. 4 is a cross-sectional view of an EEPROM cell of the FLOTOX type according to the prior art.

FIG. 3 shows an example of the erase/write window of an EEPROM cell obtained by the endurance testing system for an EEPROM according to the preferred embodiment of the invention. From such a figure, the endurance of an EEPROM cell can be readily evaluated.

While the present invention has been explained in relation to its preferred embodiment, it is to be understood that various modifications thereof will be apparent to those skilled in the art upon reading this specification. For example, the detected threshold voltage can be converted into a digital signal by an analog-to-digital converter, which can be interpreted and processed by a processing unit, to improve the automation degree of the endurance testing system. Furthermore, the present invention can also be readily applied in the endurance test of a PMOS EEPROM cell without departing from the gist thereof.

Therefore, it is to be understood that the invention disclosed herein is intended to cover all such modifications as fall within the scope of the appended claims.

We claim:

1. An endurance testing system for an EEPROM, comprising:

a processing unit for generating control signals for testing the endurance of an EEPROM cell;

a pulse generator connected to the processing unit for generating a pulse to be applied on the EEPROM cell according to the control signals from the processing unit; and a control and test circuit receiving the control signals and the pulse respectively from the processing unit and the pulse generator and connected to the EEPROM cell for controlling the EEPROM cell and detecting the threshold voltage thereof according to the control signals.

2. The endurance testing system for an EEPROM of claim 1, further comprising a display unit for automatically showing the detected threshold voltage of the EEPROM cell.

3. The endurance testing system for an EEPROM of claim 1, wherein the control and test circuit includes a tracking circuit for automatically detecting the threshold voltage of the EEPROM cell.

4. The endurance testing system for an EEPROM of claim 3, wherein the tracking circuit is in a negative feedback form.

5. The endurance testing system for an EEPROM of claim 1, wherein the pulse generator generates a pulse with different duration and magnitude according to the control signals from the processing unit.

6. The endurance testing system for an EEPROM of claim 1, wherein the EEPROM cell controlled by the control and test circuit has a write operation, an erase operation and a threshold voltage-testing operation.

7. The endurance testing system for an EEPROM of claim 6, further comprising a display unit for automatically showing difference between the threshold voltages respectively after a write operation and an erase operation of the EEPROM cell.

8. The endurance testing system for an EEPROM of claim 1, further comprising an analog-to-digital converter for converting the detected threshold voltage of the EEPROM cell into a digital value.

9. An endurance testing system for an EEPROM, comprising:

a processing unit for executing a program for testing the endurance of an EEPROM cell having a write operation, an erase operation and a threshold voltage-testing operation to generate control signals for the operations of the EEPROM cell;

a pulse generator connected to the processing unit for generating a pulse to be applied on the EEPROM cell according to the control signals from the processing unit;

a control circuit receiving the control signals and the pulse respectively from the processing unit and the pulse generator and connected to the EEPROM cell for controlling the operations of the EEPROM cell according to the control signals; and a test circuit receiving the control signals from the processing unit and connected to the EEPROM cell for tracking and detecting the threshold voltage of the EEPROM cell according to the control signals.

10. The endurance testing system for an EEPROM of claim 9, further comprising a display unit for automatically showing the detected threshold voltage of the EEPROM cell.

11. The endurance testing system for an EEPROM of claim 9, further comprising a display unit for automatically showing difference between the threshold voltages respectively after the write and the erase operations of the EEPROM cell.

12. The endurance testing system for an EEPROM of claim 9, wherein the test circuit is constructed by utilizing negative feedback principles.

13. The endurance testing system for an EEPROM of claim 9, wherein the pulse generator generates a pulse with different duration and magnitude according to the control signals from the processing unit.

14. The endurance testing system for an EEPROM of claim 9, further comprising an analog-to-digital converter for converting the detected threshold voltage of the EEPROM cell into a digital value.

* * * * *